United States Patent [19]

Bergmans et al.

[11] Patent Number: 4,856,026
[45] Date of Patent: Aug. 8, 1989

[54] DATA TRANSMISSION SYSTEM COMPRISING SMEARING FILTERS

[75] Inventors: Johannes W. M. Bergmans; Theodoor A. C. M. Claasen; Petrus J. Van Gerwen, all of Eindhoven, Netherlands

[73] Assignee: U.S. Philips Corporation, New York, N.Y.

[21] Appl. No.: 143,914

[22] Filed: Jan. 13, 1988

[30] Foreign Application Priority Data

Jan. 14, 1987 [NL] Netherlands ............................ 8700075

[51] Int. Cl.⁴ ...................... H04B 15/00; H04B 27/10
[52] U.S. Cl. ..................................... 375/58; 364/825; 364/724.16; 333/18
[58] Field of Search .................. 375/11, 12, 96, 60, 375/18, 39; 364/724, 825; 333/18, 28 R

[56] References Cited

U.S. PATENT DOCUMENTS

| | | | |
|---|---|---|---|
| 3,949,206 | 4/1976 | Edwards et al. | 375/11 |
| 4,121,295 | 10/1978 | Witt | 364/72 X |
| 4,476,539 | 10/1984 | Tamori et al. | 364/825 |
| 4,646,327 | 2/1987 | Kojima et al. | 364/72 X |

OTHER PUBLICATIONS

G. F. M. Beenker et al., "Design of Smearing Filters for Data Transmission Systems", IEEE Transactions on Communications, vol. COM-33, No. 9, Sep. 1985, pp. 955-963.

G. F. M. Beenker et al., "Binary Sequences with a Maximally Flat Amplitude Spectrum", Philips J. Res. 40, 289-304 (1985).

P. J. V. Gerwen et al., "Microprocessor Implementation of High-Speed Data Modems", IEEE Transactions on Communications, vol. COM-25, No. 2, Feb. 1977, pp. 238-250.

S. J. M. Tol et al., "Measured Performance of ISDN Transmission in the Dutch Local Telephone Network", Proc. ISSLS 86, Tokyo, pp. 302-307.

*Primary Examiner*—Robert L. Griffin
*Assistant Examiner*—Stephen Chin
*Attorney, Agent, or Firm*—Thomas A. Briody; Jack E. Haken; Anne E. Barschall

[57] ABSTRACT

The transmitter (DTR) and the receiver (DRC) of a system for transmitting data signals at a given symbol rate 1/T comprise discrete-time smearing filters (SM and DSM) for combatting the effect of additive pulse-like disturbances (p'(t)) in the transmission channel (TCH). In many cases these disturbances (p'(t)) turn out to have a pronounced bandwidth-limited nature. By utilizing this feature the implementation of the smearing filters (SM and DSM) is simplfied and/or their performance level is improved in that the non-zero values of their impulse responses s(i) and d(j) only occur at the points of grids of the indices i and j recurring with a period of L, where L is an integer greater than 1 and where L is determined substantially by the ratio $L_0$ of the symbol rate 1/T to twice the highest significant frequency $f_m$ of these disturbances (p'(t)).

20 Claims, 4 Drawing Sheets

DATA TRANSMISSION SYSTEM COMPRISING SMEARING FILTERS

BACKGROUND OF THE INVENTION

The invention relates to a transmission system for transmitting data signals at a given symbol rate 1/T through a channel in which additive pulse-like disturbances occur, which system comprises a data transmitter having a discrete-time smearing filter with a finite impulse response s(i) with i=0, 1, 2, ..., $N_s-1$, where $N_s$ represents the length of this impulse response, and a data receiver having a discrete-time smearing filter with a finite impulse response d(j) with j=0, 1, 2, ..., $N_d-1$, where $N_d$ represents the length of this impulse response, which smearing filters are substantially complementary and which impulse response d(j) can assume only coarsely quantized values.

Such a transmission system is known from an article entitled "Design of Smearing Filters for Data Transmission Systems" by G. F. M. Beenker et al, published in IEEE Trans. Commun., Vol. COM-33, No. 9, September 1985, pp. 955-963.

As described in the above article, smearing filters placed at the transmit and receive ends of the system are used for combatting the influence of concentrated pulse-like disturbances which can occur in the transmission channel at irregular instants that are usually rather far apart. Such pulse-like disturbances are generally referred to as impulse noise.

According to the design strategy for smearing filters discussed in this article, those filter impulse responses s(i) and d(j) are looked for, for which the performance as regards smearing efficiency and suppression of the intersymbol interference caused by the cascade combination of the two filters is optimized. In addition, it is noted that the implementation of these smearing filters can be simplified by avoiding complicated multiplying operations. This is allowed as according to the above article the impulse responses of the smearing filters can be defined by coarsely quantized coefficients, more specifically, binary or ternary coefficients, without thereby essentially impairing the performance of the smearing filters.

Recent developments in the field of data processing and data transmission have led to concepts of systems and implementations, in which data streams have to be transmitted at high rates. This is illustrated, for example, by the ISDN concept having a standardized net bit rate of 144 kbit/s for the user. For economic reasons, the implementation requires the use of already available transmission cables, such as, for example, the so-called quad-pair cables. In such a situation the wire pairs for conventional analog telephone traffic are housed in one and the same cable as the wire pairs intended for ISDN circuits. The aforesaid pulse-like disturbances can be injected into such ISDN circuits from adjacent wire pairs. Such pulse-like disturbances are especially annoying in those cases wherein such ISDN circuits range over relatively large distances. In this way, dialling pulses and other kinds of signalling pulses occurring in conventional analog telephone circuits can considerably impair the quality of adjacent ISDN circuits as a result of their high voltage values, such as 60-80 volts peak-to-peak.

As can be seen from an article entitled "Measured Performance of ISDN Transmission in the Dutch Local Telephone Network" by S. J. M. Tol and W. van der Bijl, published in Proc. ISSLS 86, Tokio, pp. 302-307, the above-mentioned pulse like disturbances to be combatted do not have any significant content above approximately 30 kHz and therefore these disturbances have a pronounced band-limited nature. The bandwidth of such pulse-like disturbances can be considerably smaller than the Nyquist bandwidth 1/(2T) of the data signals to be transmitted.

The invention has for its object to provide a transmission system of the type mentioned in the opening paragraph in which the aforesaid bandwidth-limited nature of the pulse-like disturbances is utilized to further simplify the implementation of smearing filters and/or to improve their performance level.

The transmission system according to the invention is characterized in that the non-zero values of the respective impulse responses s(i) and d(j) only occur at the points of grids of the respective indices i and j recurring with a period of L, where L is a factor representing an integer greater than 1 and where L is determined substantially by the ratio $L_o$ of the symbol rate 1/T to twice the highest significant frequency $f_m$ of the occurring pulse-like disturbances.

The invention provides a way of reducing the coefficient density of the filters roughly by the above factor L and thereby simplifying their implementation without affecting their performance level. Conversely the measures in accordance with the invention can be used to achieve an improved performance level with unchanged complexity.

The impulse response of a smearing filter in accordance with the invention solely has real values. This implies that only the part of the transfer function corresponding to the impulse response and situated between 0 and 1/(2T) in the fundamental interval of the data signals the size of 1/T can be selected freely. As, apparently, the pulse-like disturbances to be combatted in the local public telephone network do not have a significant spectral content above roughly 30 kHz, in the case of ISDN circuits a relatively large part of the fundamental interval of the data signals the size of 1/T is strictly speaking irrelevant to the smearing function, so that the fundamental interval of the transfer function can be reduced, more specifically, by the above L-factor. Therefore, the design of a smearing filter in accordance with the invention is not based on a fundamental interval equal to 1/T but on a fundamental interval equal to 1/(LT). Worded differently, within the band between 0 and 1/(2LT) the transfer function can be chosen at freely and due to its periodic character this function is fixed for all other frequencies.

It should be noted that the U.S. Pat. No. 4,476,539 discloses a transmission system comprising a smearing filter at the transmit end and a smearing filter at the receive end. According to this technique known per se the smearing filters are implemented as a tapped cascade combination of delay elements, each of which introduces a time delay of T. Herein T=1/(2$F_m$), where $F_m$ represents the highest frequency of an information signal to be transmitted. In the above Patent it is likewise proposed to introduce a time delay mT between adjacent taps, where m is an integer greater than 2. With respect to the object and implementation, however, such smearing filters known per se are basically different from the smearing filters used in a transmission system in accordance with the invention. According to the known technique it is proposed to dimension a smearing filter implemented in the above way such that the group-delay characteristic has a sinusoidal shape. This implies that of necessity the filter coefficients have to be quantized finely, entailing a relatively large complexity of the filter implementation. In addition, the impulse response of the transmit-end smearing filter is required to be the time-inverse of the impulse response of the receive-end smearing filter. This imposes a restriction on the filter design, which restriction is absent for smearing filters as employed in a transmission system in accordance with the present invention.

BRIEF DESCRIPTION OF THE DRAWINGS

The invention will not be further explained with reference to the drawing, in which.

DESCRIPTION OF A PREFERRED EMBODIMENT

Figure 1:
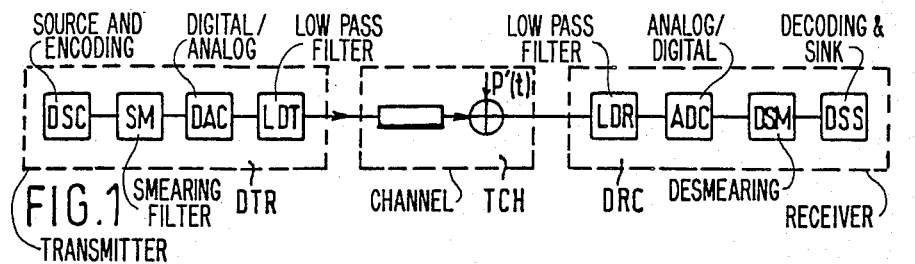
FIG. 1 shows a diagram of a transmission system comprising a smearing filter at the transmit and receive ends for combatting impulse noise which may occur in the transmission channel between transmit end and receive end.

The effect of impulse noise, that is to say concentrated pulse-like disturbances which can occur in a transmission channel of a transmission system at irregular instants that generally are relatively far apart, can be combatted by inserting smearing filters in such a transmission channel as schematically shown in FIG. 1. FIG. 1 shows the block DTR as a schematic representation of a data signal transmitter, the block TCH as a schematic representation of a transmission channel and the block DRC as a schematic representation of a data signal receiver. The data signal transmitter comprises a combination of a data signal source and an associated encoding circuit denoted DSC, a transmit-end smearing filter SM, a digital-to-analog converter DAC and a low-pass transmit filter LDT. In FIG. 1 the total impulse noise as actually present in the transmission channel is indicated by p'(t), in other words, as an analog noise voltage additively combined with the useful data signal. The data signal receiver DRC comprises a low-pass receive filter LDR, an analog-to-digital converter ADC, a receive-end smearing filter DSM and a combination of a decoding circuit with a data signal sink indicated by DSS. The smearing filter DSM inserted at the receive end is arranged for smearing with respect to time the pulse-like disturbances applied thereto and for attenuating their amplitude. The unavoidable distorting effect on the actual data signal inherent to such a smearing operation has to be obviated by the substantially complementary smearing filter SM inserted at the transmit end. In the ideal case the cascade combination of the filters SM and DSM with the transmission channel will merely cause a delay. In practice, however, these filters are not exactly complementary, causing the cascade combination of the filters SM and DSM to introduce intersymbol interference which has to be kept within certain limits in order to maintain the transmission quality at an acceptable level.

Figure 2:
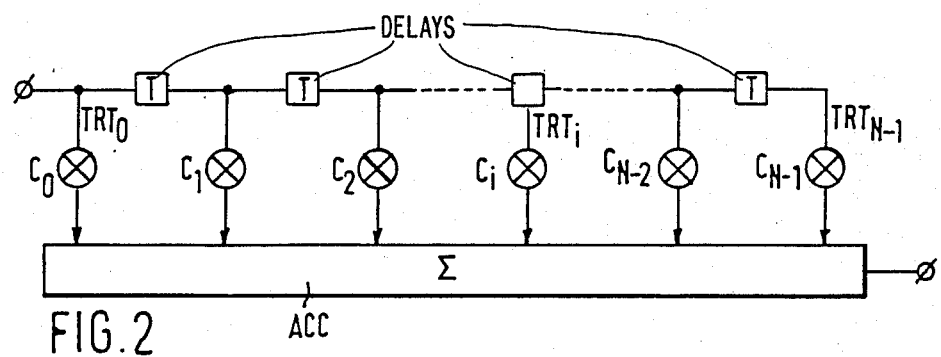
FIG. 2 shows a diagram of a conceptual structure of such a smearing filter.

The conceptual structure of a discrete-time transversal filter which is used according to known techniques as the implementation of the filters SM and DSM, is shown schematically in FIG. 2. For completeness, it should be observed in this context that numerous implementations of this conceptual structure are possible for a discrete-time transversal filter. In general, such a filter comprises a plurality of delay elements T, each forming a filter series branch causing a delay T corresponding with a symbol interval of a data signal applied to the filter input. The filter further comprises a number of transversal branches $TRT_i$ with $i=0, 1, 2, \ldots, N-1$. A signal derived via such a transversal branch $TRT_i$ from the associated serial branch is multiplied by a filter coefficient $C_i$ with $i=0, 1, 2, \ldots, N-1$ assigned to the associated transversal filter branch. A summing circuit or accumulator ACC is arranged for obtaining the filter output signal by summing the signals formed by the transversal branches of the filter. As the output signal of the data signal-source DSC usually has not more than two or three amplitude levels, the smearing filter SM at the transmit end can be implemented irrespective of its impulse response without the need for performing complicated digital multiplication operations. For completeness, the reader is referred to an article entitled "Microprocessor Implementation on High-Speed Data Modems" by P. J van Gerwen et al., published in IEEE Trans. Commun., Vol. COM-25, No. 2, February 1977, pp. 238–250. On the other hand, the signal applied to the input of the smearing filter DSM inserted at the receive end has a relatively large number of amplitude levels. By coarsely quantizing the impulse response of this smearing filter at the receive end, which narrows down to the fact that such impulse response can, for example, be described by binary, ternary, quaternary or quinary coefficients, such digital multiplication operations can likewise be avoided in the smearing filter at the receive end. In this context it should be observed that when dealing with coarse quantizing a number of quantization levels has to be thought of that is adapted to the circumstances and that usually will not be greater than 16.

Figure 3:
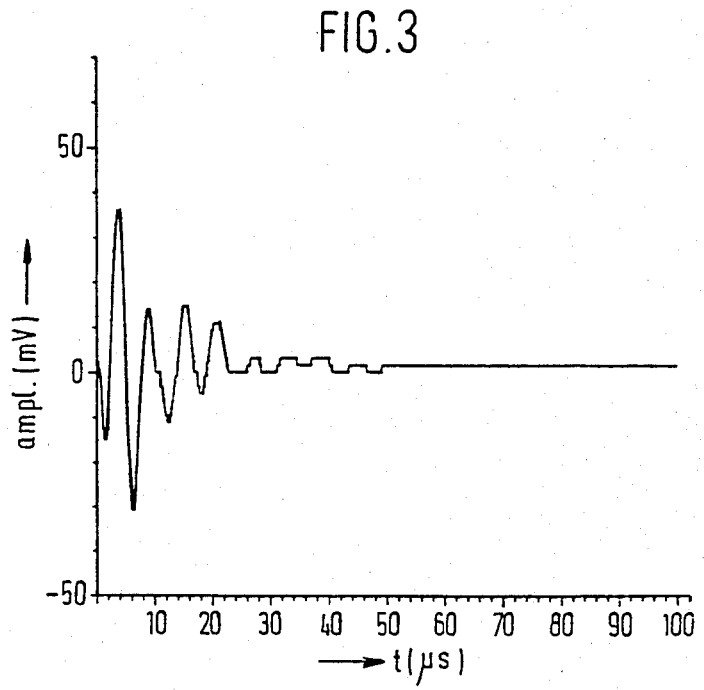
FIG. 3 shows a waveform that is characteristic of the kind of pulse-like disturbances that have to be combatted.

It can be expected that normal wire pairs used for analog telephone traffic will be the main cause of the above-mentioned pulse-like disturbances which can be injected into adjacent wire pairs housed in the same cable and used for transmitting data streams. It has turned out that the injected pulse-like disturbances to be expected have a waveform and a spectrum of the shape as represented (in stylized form) in FIG. 3 and FIG. 4 respectively. Further investigations have shown that such an impulse noise will have an extremely disturbing effect on the transmission properties, in particular for ISDN circuits with a cable length of roughly 5 km or over. As shown in FIG. 3 such a pulse-like disturbance extends over a time interval of the order of 100 μs, whoch corresponds to approximately 16 symbol intervals, at least at a transmission rate customary in an ISDN system (order of magnitude of 152 kbit/s).

Figure 4:
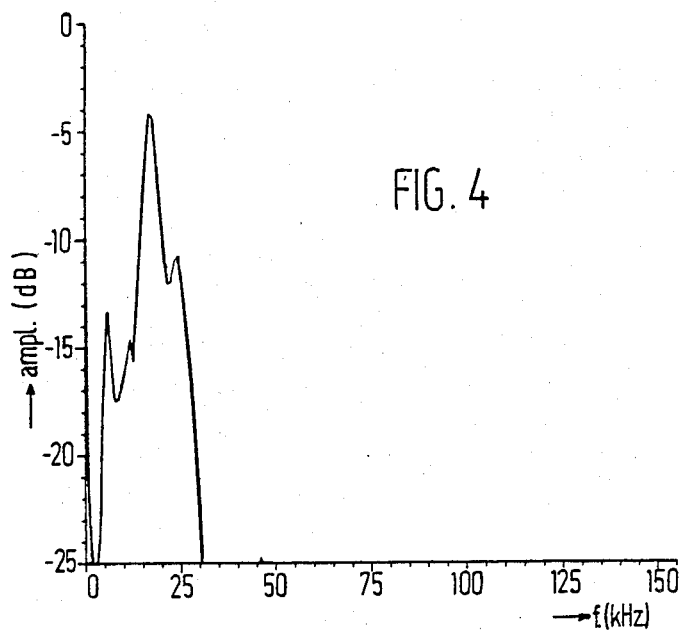
FIG. 4 shows the amplitude spectrum of the waveform shown in FIG. 3.

As shown in FIG. 4, such pulse-like disturbances have a pronounced bandwidth-limited nature. Within the frame-work of the present invention this feature is used to simplify the implementation of the smearing filters and/or to improve their performance level.

Figure 5:
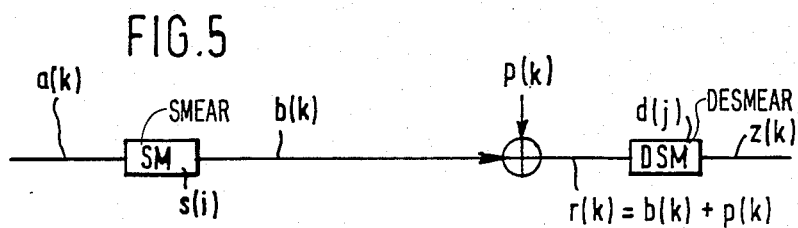
FIG. 5 shows a diagram of a time-discrete model of a cascade connection of a transmit-end smearing filter and a receive-end smearing filter via an "ideal" transmission channel, in which only additive disturbances occur.

FIG. 5 shows a diagram of a discrete-time model of the transmission system represented in FIG. 1, into the transmission channel of which a pulse-like disturbance is injected of the type represented in FIGS. 3 and 4. In FIGS. 5 and 1 elements of the same kind are indicated by the same reference symbols. FIG. 5 likewise shows schematically that a pulse-like disturbance p(k) occurs at the input of the smearing filter DSM at the receive end, which disturbance is the filtered and digitized version of the additive disturbance, injected into the transmission channel and indicated in FIG. 1 by p'(t). The data signal source DSC (FIG. 1) supplies a data symbol a(k) to the transmit-end smearing filter SM during each symbol interval k (or each T seconds). This transmit-end smearing filter has an impulse response s(i) with $i=0, 1, 2, \ldots, N_s-1$ where $N_s$ represents the length of the smearing filter SM. This smearing filter SM forms an output sample b(k) from each input sample according to $$b(k) = (a \ast s)(k) \quad (1)$$

Herein the symbol $\ast$ represents the linear convolution operation. If the above pulse-like disturbances do not occur and if the necessary provisions have been taken in the transmission system for combatting background noise and intersymbol interference, the series of samples b(k) will appear at the input of the receive-end smearing filter DSM substantially undistorted. However, if an additive pulse-like disturbance p(k) is injected into the input signal r(k) of the receive-end smearing filter DSM, this input signal r(k) of this receive-end smearing filter can be represented as a good approximation by $$r(k) = b(k) + p(k) \quad (2)$$

For the output signal z(k) of the receive-end smearing filter DSM the following equation holds $$z(k) = (a \ast s \ast d)(k) + (p \ast d)(k) \quad (3)$$

In this formula (3), the impulse response of the receive-end smearing filter DSM having a length of $N_d$ is represented by d(j) with $j=0, 1, 2, \ldots, N_d-1$. According to a customary notation, in which connection reference is made to the book entitled "Digital Signal Processing" by A. V. Oppenheim and R. W. Schafer, Prentice-Hall, Inc. 1975, it can be derived from formula (3) by applying the Fourier transformation $$Z(f) = S(f) \cdot D(f) \cdot A(f) + P(f) \cdot D(f) \quad (4)$$

Herein Z(f), S(f), D(f), A(f) and P(f) are the Fourier-transforms of z(k), s(k), d(k), a(k) and p(k), respectively. If the smearing filters at the transmit and receive end are sufficiently complementary the formula (3) can be simplified to $$z(k) = a(k - N_0) + (p \ast d)(k) \quad (5)$$

Herein $N_0$ represents the signal delay time introduced by the cascade combination and expressed in a number of sample periods. The second term in the right-hand portion of the formula (5) describes the smearing process undergone by the pulse-like disturbance p(k) in the receive-end smearing filter DSM having impulse response d(k). As disclosed in the above article by G. F. M. Beenker et al., the design of the smearing filters is based inter alia on striving to reduce the maximum amplitude of this second term to the lowest possible value whilst still maintaining a certain minimum requirement as to the degree of complementarity.

As is shown in FIG. 3, it can be assumed in the case of the local public telephone network that a pulse-like disturbance extends over a time span roughly corresponding to 10–15 symbol intervals T for a transmission rate of approximately 152 kbit/s. In the above article by Beenker et al. it is shown that effective smearing can only be achieved by using an impulse response d(j) for the receive-end smearing filter DSM which extends over a time span that is many times longer than that of the pulse-like disturbances.

In the case of ISDN, the said impulse response d(j) should therefore extend over far more than 100 symbol intervals T. To achieve a sufficient degree of complementarity the same holds for the impulse response s(i) of the transmit-end smearing filter SM. Taking account of the relatively high transmission rates of the data signals which the respective smearing filters have to be able to process, and of the accurately quantized nature of the input signal of a receive-end smearing filter, this time span will lead to a rather great complexity even if the coefficients of this receive-end smearing filter are coarsely quantized. Within the framework of the present invention the aim has been to implement in a more economical manner the smearing filters at the transmit and receive ends using the available technologies without appreciably impairing their performance level.

The invention is based on the idea, when implementing a smearing filter in the transmission system under discussion, of utilizing the knowledge that the pulse-like disturbance to be combatted is strongly limited in bandwidth. More specifically, the starting point has been the ratio $L_o$ of the symbol rate 1/T of a data signal to be processed and a frequency equal to twice the highest significant frequency $f_m$ of the pulse-like disturbances to be combatted.

In general, a smearing filter having a time-domain impulse response represented by s(i) for smearing at the transmit end or by d(j) for smearing at the receive end has a periodic transfer function S(f) or D(f), respectively, in the frequency-domain and the width of the fundamental interval of this transfer function is represented by 1/T. If the respective impulse response s(i) or d(j) can be described by real values only, this will enable the transfer function S(f) or D(f), respectively, to be chosen freely in a frequency band between the values 0 and 1/(2T). As the pulse-like disturbances in the local public telephone network do not have any significant spectral content above approximately 30 kHz, this implies, for example at a symbol rate of 152 kbit/s, that strictly speaking more than half the range is irrelevant to smearing operations. According to an aspect of the present invention it is proposed to reduce the width of the fundamental interval of the transfer function by a factor of L in order to simplify the implementation of the smearing filters, this factor being an integer greater than 1 and being determined substantially by the above $L_0$-ratio. Designing a smearing filter in accordance with the invention is now based on a fundamental interval the size of $1/(LT)$, instead of a fundamental interval the size of $1/T$. Worded differently: in the band between 0 and $1/(2LT)$ the transfer function $S(f)$ or $D(f)$, respectively, can be chosen freely, whereas this function is fixed for all other frequency values due to its periodic character. In the time-domain all this means that with a smearing filter used in a transmission system in accordance with the present invention, the non-zero values of the relevant impulse responses $s(i)$ and $d(j)$, respectively, only occur at the points of grids of the respective indices i and j recurring with a period of L, where L is the previously defined factor mainly determined by the said $L_0$-ratio.

Figure 6:
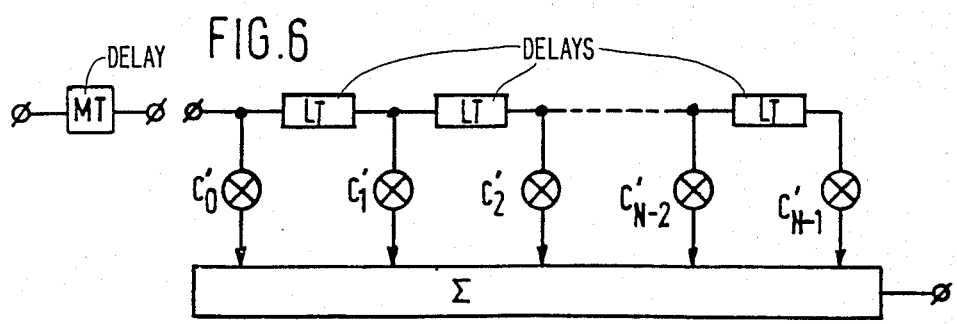
FIG. 6 shows a diagram of a conceptual structure of a smearing filter in accordance with the present invention.

The conceptual structure of a smearing filter in accordance with the invention is diagrammatically shown in FIG. 6. The delay element MT inserted at the filter input, where $0 \leq M \leq L-1$ schematically shows that in accordance with the invention an arbitrary grid from a set of L grids of the indices i and j, respectively, mutually shifted over a distance T, can be used for the values of the associated filter impulse response possibly differing from zero.

This means, for example, that the impulse response $d(j)$ of a receive-end smearing filter according to the invention for a selected value of L is equal to zero at index values j situated between the indicated grid points, whereas this impulse response for the above indicated grid points can be unequal to zero. When assuming $L=3$ and $M=0$ this impulse response $d(j)$ is equal to zero for the j-values 1, 2, 4, 5, 7, 8, 10, 11 etc. and can have a value differing from zero for the j-values 0, 3, 6, 9, etc. Thus, by means of a smearing filter according to the invention the complexity thereof can be reduced roughly by the factor L, whereas the smearing effect is equal to that of a filter having the same length and being implemented according to a known technique. It can be of practical advantage to select the value for the factor L which is the nearest power of two larger than the above-mentioned $L_0$-ratio.

The fact that a smearing filter at the transmit end and a smearing filter at the receive end are substantially complementary implies among other things that the transfer functions of these two filters have the same fundamental interval. This means that the distance between adjacent coefficients that possibly differ from zero is allowed to be increased by a same factor L for the smearing filter at the transmit end and the receive end. Worded differently, with the invention it is possible to reduce the coefficient density of the two smearing filters by the same factor L. Roughly speaking the number of filter operations per time unit can thus be reduced by the factor L. In addition to the simplification achieved when utilizing the design as explained in the above article by Beenker et al., a further simplification of the implementation of such smearing filters can thus be achieved.

For the design of the smearing filters use is made of techniques known per se. Such a technique is, for example, described in an article entitled "Binary Sequences with a Maximally Flat Amplitude Spectrum" by G. F. M. Beenker et al., published in Philips J. Res., Vol., 40, No. 5, 1985, pp. 289–304. In broad outlines such a technique boils down to generating and examining a large number of "candidate" filters, those filters which meet certain specifications in the best possible way being selected.

Figure 7:
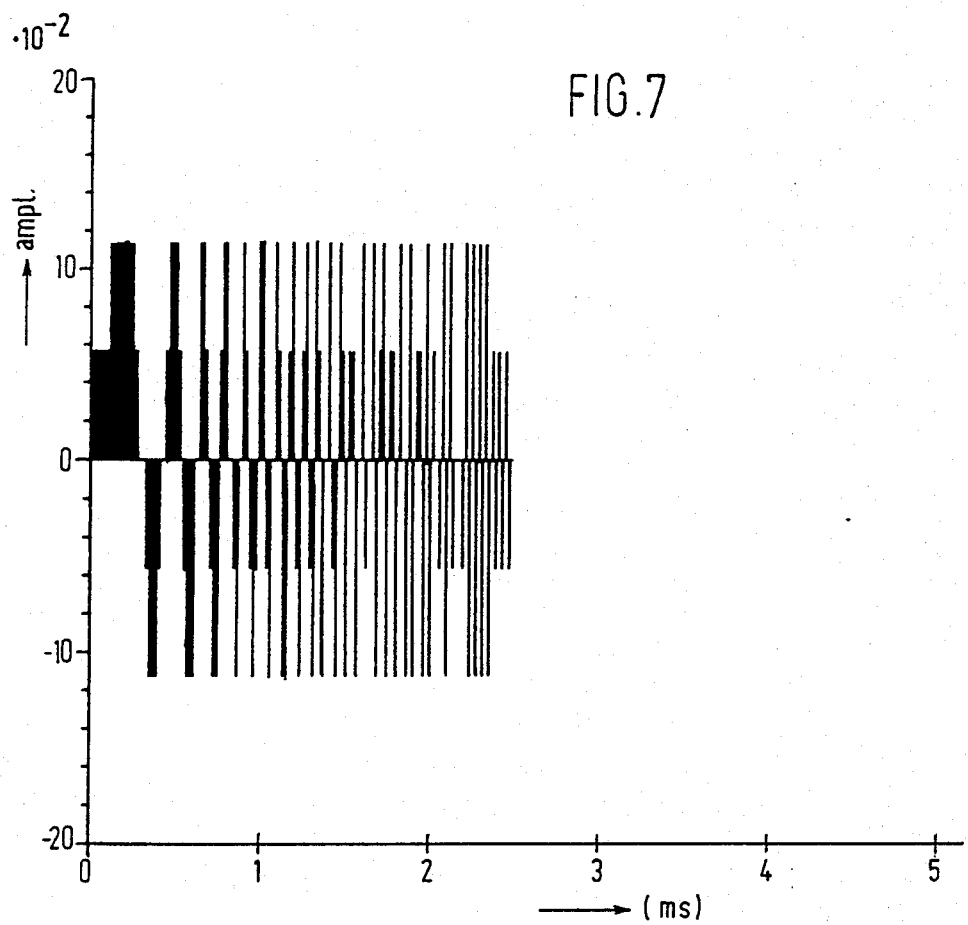
FIG. 7 shows an impulse response of an optimized smearing filter inserted at the receive end and having quinary coefficients.
Figure 8:
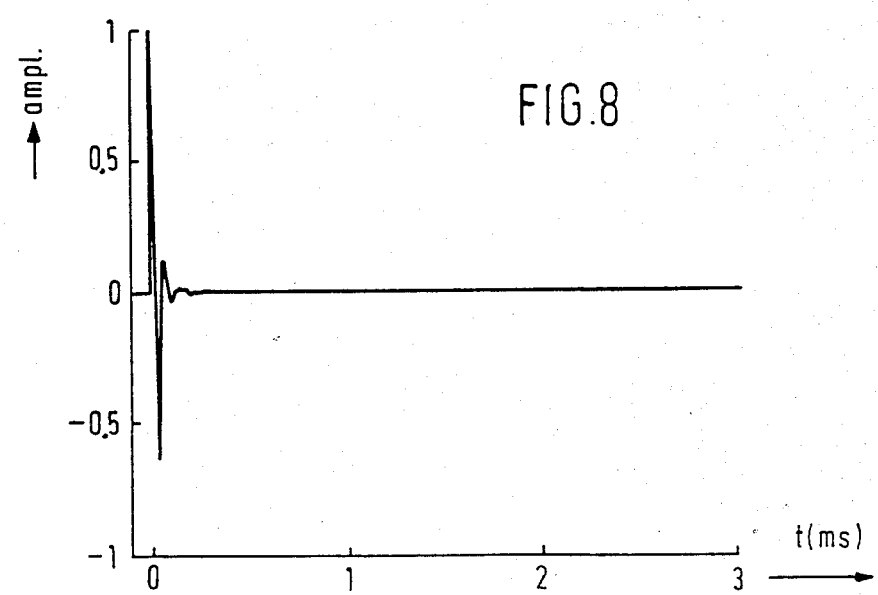
FIG. 8 shows a waveform of a characteristic disturbing pulse.
Figure 9:
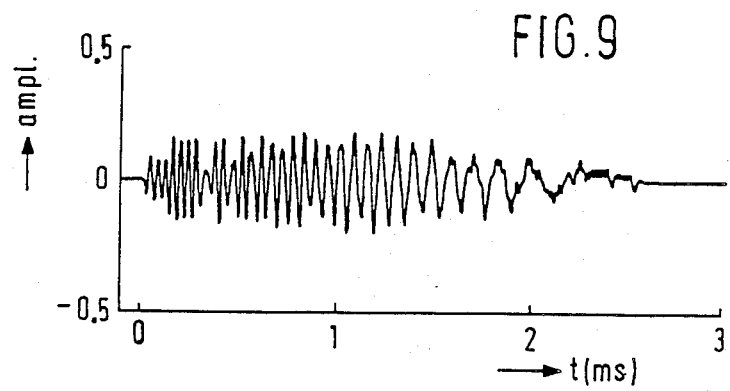
FIG. 9 shows a disturbing pulse according to FIG. 8 after being smeared by a filter having an impulse response according to FIG. 7.

The FIGS. 7, 8 and 9 illustrate several functions associated with a filter having quinary filter coefficients $C'_0$, $C'_1, \ldots, C'_{N-2}, C'_{N-1}$ and $L=3$. FIG. 7 shows the impulse response $d(j)$ of a smearing filter to be used at the receive end and having a length of $N=N_d=379$. FIGS. 8 and 9 illustrate a characteristic pulse-like disturbance of the type mentioned above with respect to the FIGS. 3 and 4, smeared by a filter according to the invention over an interval corresponding to approximately 400 data symbol intervals, an amplitude suppression factor of approximately 4.77 being achieved. As further appears from FIG. 9, the energy of the pulse-like disturbance is smeared virtually uniformly over the whole time interval. In order to keep the intersymbol interference, introduced by a cascade combination of a transmit-end and a receive-end smearing filter, within practically acceptable limits, the filter coefficients of the transmit-end smearing filter should be quantized finely, implying that these filter coefficients should be represented by, for example, at least 8 bits.

Figure 10:
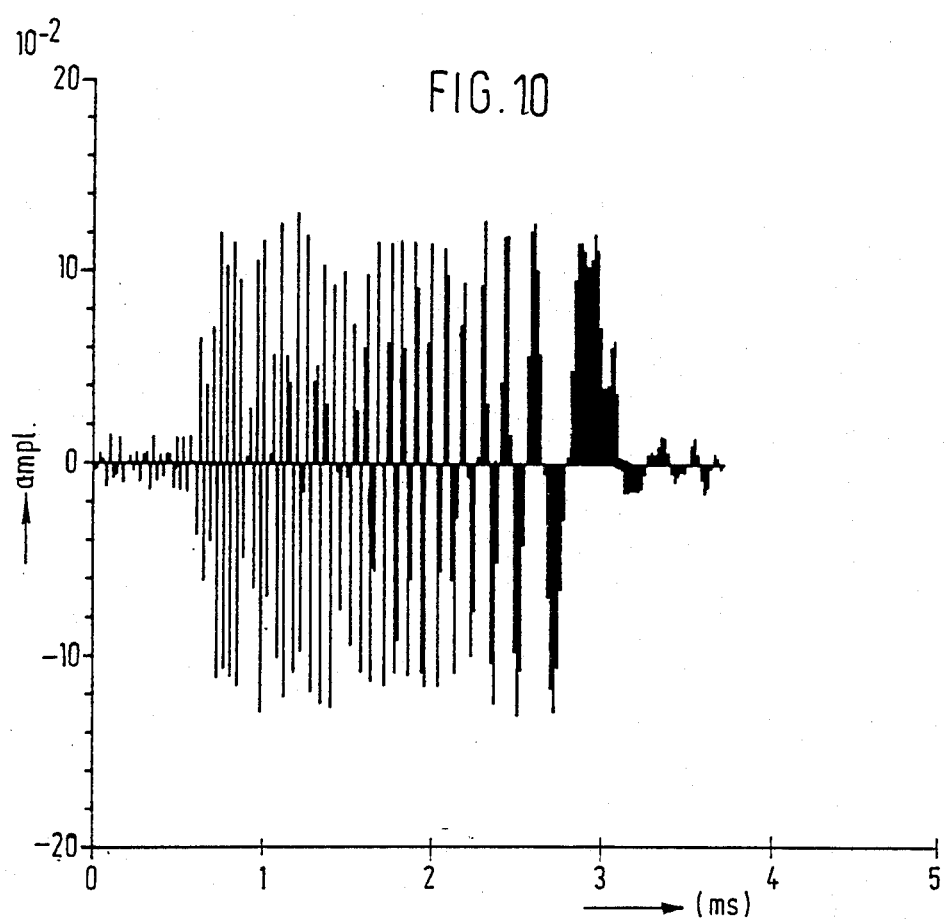
FIG. 10 shows an impulse response of an optimized transmit-end smearing filter having accurately quantized coefficients and complementing in the best possible manner the receive-end smearing filter with quinary coefficients having an impulse response according to FIG. 7.

The freedom with respect to making the two smearing filters complementary can be further increased by selecting a longer smearing filter at the transmit end than at the receive end. FIG. 10 illustrates these possibilities showing the impulse response $s(i)$ of a smearing filter at the transmit end having $L=3$ and a length of $N_s=565$, which filter is optimized to complement in the best possible way the associated receive-end smearing filter of FIG. 7 having $L=3$ and quinary coefficients.

As the invention makes it possible for these receive-end smearing filters to be realized with coarsely quantized impulse response values, and as the input signals of the transmit-end smearing filters only have a small number of amplitude values, thus are coarsely quantized too, such filters can be manufactured more economically in the currently available VLSI technology.

For completeness, it should be stated that the present invention can be used for transmission systems in which data signals are transmitted in the baseband, as well as for transmission systems in which data signals are transmitted in a suitably selected passband by means of modulation, like for example two-phase modulation in which data signals are modulated on a square-wave carrier signal of symbol frequency $1/T$.

It should further be observed that the present invention can likewise be used when the pulse-like disturbances indicated above have a spectrum of a band-pass character instead of a low-pass character discussed so far. For it is still possible to divide the frequency band between 0 and $1/(2T)$ into L bands of equal width so that a single sub-band substantially covers the band-pass spectrum of the pulse-like disturbances. Due to the periodic character of the transfer functions of the relevant smearing filters the considerations given so far can be applied to the version of the band-pass spectrum repeated in the lowest sub-band between 0 and $1/(2LT)$.

What is claimed is:

1. A transmission system for transmitting data signals at a given symbol rate $1/T$ through a channel in which additive pulse-like disturbances occur, which system comprises:

a. a data transmitter having:
a transmit discrete-time smearing filter with a finite impulse response s(i), with i=0, 1, 2, ..., $N_{s-1}$, where $N_s$ represents the length of the impulse response s(i), the impulse response s(i) having non-zero values occurring only at values of i which recur with a period of L, where L is an integer greater than one and is greater than or approximately equal to a ratio $L_0$ of the symbol rate 1/T to twice a frequency $f_m$, which frequency $f_m$ is a highest significant frequency of the pulse-like disturbances; and b. a data receiver having:
a receive discrete-time smearing filter with a finite impulse response d(j) with j=0, 1, 2, ..., $N_{d-1}$, where $N_d$ represents the length of the impulse response d(j), the receive smearing filter being substantially complementary to the transmit smearing filter, the impulse response d(j) assuming only coarsely quantized values, the impulse response d(j) having non-zero values occurring only at values of j which recur with a period of L.

2. The system of claim 1 wherein L is the nearest power of two larger than $L_0$.

3. The system of claim 1 wherein the receive smearing filter has a plurality of coefficients which are respectively achieved with less than 16 quantizing levels.

4. The system of claim 3 wherein the coefficients are respectively achieved with less than five quantizing levels.

5. The system of claim 1 wherein the impulse response of the transmit smearing filter is finely quantized.

6. The system of claim 5 wherein the transmit smearing filter has a plurality of coefficients at least one of which is represented using eight bits.

7. The system of claim 1 wherein s(i) is not the identical time inverse of d(j).

8. The system of claim 7 wherein $N_s$ is substantially greater than $N_d$.

9. The system of claim 1 wherein a group delay characteristic of the receive smearing filter is not sinusoidal.

10. The system of claim 1 wherein:
a. the pulse-like disturbances have a band-pass spectrum, and
b. $f_m$ is the bandwidth of the band-pass spectrum.

11. The system of claim 1 wherein the pulse-like disturbances have a low-pass spectrum having frequencies less than 30 kHz and $f_m$=30 kHz.

12. The system of claim 1 wherein the data signals are transmitted in the baseband.

13. The system of claim 1 wherein the data signals are transmitted in the passband.

14. The system of claim 1 wherein s(i) is coarsely quantized.

15. A transmit discrete-time smearing filter for use in a data transmitter of a transmission system, which system is for transmitting data signals at a given symbol rate 1/T through a channel in which additive pulse-like disturbances occur, and which system includes:

a. the data transmitter; and
b. a data receiver having:
a receive discrete-time smearing filter with a finite impulse response d(j) with j=0, 1, 2, ..., $N_{d-1}$, where $N_d$ represents the length of the impulse response d(j), the impulse response d(j) assuming only coarsely quantized values, the impulse response d(j) having non-zero values occurring only at values of j which recur with a period of L, where L is an integer greater than one and is greater than or approximately equal to a ratio $L_0$ of the symbol rate 1/T to twice a frequency $f_m$, which frequency $f_m$ is a highest significant frequency of the pulse-like disturbances;

the transmit smearing filter having a finite impulse response s(i), with i=0, 1, 2, ..., $N_{s-1}$, where $N_s$ represents the length of the impulse response s(i), the transmit smearing filter being substantially complementary to the receive smearing filter, the impulse response s(i) having non-zero values occurring only at values of i which recur with a period of L.

16. The transmit smearing filter of claim 15 wherein L is the nearest power of two larger than $L_0$.

17. The transmit smearing filter of claim 15 wherein $N_s$ is substantially greater than $N_d$.

18. A receive discrete-time smearing filter for use in a data receiver of a transmission system for transmitting data signals at a given symbol rate 1/T through a channel in which additive pulse-like disturbances occur, which system includes:

a. a data transmitter having:
a transmit discrete-time smearing filter with a finite impulse response s(i), with i=0, 1, 2, ..., $N_{s-1}$, where $N_s$ represents the length of the impulse response s(i), the impulse response s(i) having non-zero values occurring only at values of i which recur with a period of L, where L is an integer greater than one and is greater than or approximately equal to a ratio $L_0$ of the symbol rate 1/T to twice a frequency $f_m$, which frequency $f_m$ is a highest significant frequency of the pulse-like disturbances; and b. the data receiver;

the receive smearing filter having a finite impulse response d(j) with j=0, 1, 2, ..., $N_{d-1}$, where $N_d$ represents the length of the impulse response d(j), the receive smearing filter being substantially complementary to the transmit smearing filter, the impulse response d(j) assuming only coarsely quantized values, the impulse response d(j) having non-zero values occurring only at values of j which recur with a period of L.

19. The receive smearing filter of claim 18 wherein L is the nearest power of two larger than $L_0$.

20. The smearing filter of claim 18 wherein $N_s$ is substantially greater than $N_d$.

* * * * *